(12) United States Patent
Hecht et al.

(10) Patent No.: US 7,297,983 B2
(45) Date of Patent: Nov. 20, 2007

(54) METHOD FOR FABRICATING AN INTEGRATED CIRCUIT ON A SEMICONDUCTOR SUBSTRATE

(75) Inventors: Thomas Hecht, Dresden (DE); Henry Bernhardt, Dresden (DE); Christian Kapteyn, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/319,793

(22) Filed: Dec. 29, 2005

(65) Prior Publication Data

US 2007/0155139 A1 Jul. 5, 2007

(51) Int. Cl.
*H01L 29/04* (2006.01)

(52) U.S. Cl. ......... 257/75; 257/E21.133; 257/E29.139; 438/486

(58) Field of Classification Search ............... 257/75, 257/532, E21.133, E29.139; 438/486
See application file for complete search history.

(56) References Cited

U.S. PATENT DOCUMENTS

| | | | | |
|---|---|---|---|---|
| 6,114,200 A | * | 9/2000 | Yew et al. | 438/253 |
| 6,146,927 A | * | 11/2000 | Yamanaka | 438/149 |
| 6,861,320 B1 | * | 3/2005 | Usenko | 438/305 |
| 2003/0184705 A1 | * | 10/2003 | Murade et al. | 349/158 |
| 2004/0029343 A1 | * | 2/2004 | Seidl et al. | 438/243 |

* cited by examiner

*Primary Examiner*—Trung Dang
(74) *Attorney, Agent, or Firm*—Patterson & Sheridan, L.L.P.

(57) ABSTRACT

Integrated circuit device comprising a conductive layer and a poly-crystalline silicon layer, wherein the integrated circuit device further comprises an intermediate counter-stress layer. This intermediate counter-stress layer is arranged between the poly-crystalline silicon layer and the conductive layer, and enables stress-reduced crystallization of the poly-crystalline silicon layer. Further, the intermediate counter-stress layer is amorphous at and below a poly-silicon crystallization temperature.

21 Claims, 4 Drawing Sheets

METHOD FOR FABRICATING AN INTEGRATED CIRCUIT ON A SEMICONDUCTOR SUBSTRATE

TECHNICAL FIELD OF THE INVENTION

The present invention relates to a method for fabricating an integrated circuit on a semiconductor substrate. The present invention further relates to an integrated circuit device.

BACKGROUND OF THE INVENTION

Modern integrated electronic circuits are routinely fabricated by means of complex and extensive manufacturing processes. Over recent years, the semiconductor industry has established very sophisticated and reliable manufacturing processes, the most prominent member thereof being the so-called CMOS process. In such a process, which usually comprises hundreds of single process stages, highly integrated electronic devices, such as microprocessors or electronic data memory devices, are formed on a semiconductor substrate.

Via an elaborate sequence of deposition, etching, lithographic, and relating techniques, a plurality of electronic entities, such as resistors, capacitors or transistors, are structured and interconnected on the semiconductor substrate. Nowadays, often the integration chip of as many electronic entities as possible on a single substrate determines the overall device performance, and, eventually, the economic success of an integrated circuit. Therefore, the reduction of the minimum feature size of said electronic elements is subject to intense industrial and scientific research and development.

As far as the device design and layout are concerned, increasing the integration of electronic elements on a substrate often translates to increasing the capacitance of capacitor elements of the integrated circuit. The main factors of improvement of capacitor elements include the formation of highly conductive layers as capacitor electrodes, alongside the adoption of materials that possess a high dielectric constant, such as the so-called high-k-materials. In the state of the art, highly conductive layers are deposited on dielectrics, which include alumina, silica, and related materials, whereas metals and metal composites, such as titanium-nitride and tantalum-nitride, find broad application as base materials for the highly conductive layers. Since in the field of integrated circuit manufacturing the physics and technology of silicon is most advanced, mainly poly-crystalline silicon is used for wiring and establishing electric contact to electrode elements, such as the capacitor electrodes. Therefore, usually a poly-crystalline silicon layer is deposited on top of the highly conductive layers.

As the direct deposition of poly-crystalline silicon is technologically inexpedient, state of the art manufacturing processes firstly deposit a layer of amorphous silicon, which is subsequently rendered poly-crystalline during a heating process. This phase change of the silicon is highly sensitive to the physical structure of the material which the silicon has been deposited. It has been shown that the crystallization of silicon to a poly-crystalline state on top of common highly conductive materials results in undesired stress, and, as a consequence, to substrate deformation. Latter substrate deformation, even to a minimal extent, cause severe problems during device manufacturing, since subsequent process stages have to be aligned to each other with a high grade of accuracy, which is made impossible by a deformed substrate.

For a further increase of the integration of electronic circuits and to maximize their overall device performance, the appropriate design measures must be implemented, while maintaining a reliable and efficient manufacturing process. Consequently, there is a need for improved measures for reducing the minimum feature size.

SUMMARY OF THE INVENTION

Taking the deficits of prior art, it is an object of the present invention to provide an improved method for fabricating an integrated device. It is a further object of the present invention to provide an improved integrated circuit device.

One or several of these objects and other objects are met by the present invention.

According to a first aspect of the present invention, a method for fabricating an integrated device on a semiconductor substrate is provided, wherein the method includes steps as described in the following: in an initial step, a conductive layer on the semiconductor substrate is provided. Said semiconductor substrate may already comprise functional elements or layers, for example, doped regions of the semiconductor substrate, other conductive layers, or dielectric layers. Therefore, said conductive layer may be provided on said functional elements or layers. Preferably, said conductive layer is provided as a capacitor electrode or as a gate electrode, wherein the conductive layer is provided on a dielectric layer, which is already a part of the semiconductor substrate.

In a next step, an amorphous counter-stress layer is provided on the conductive layer. Said amorphous counter-stress layer is amorphous at and below a poly-silicon crystallization temperature. In a subsequent step, a silicon layer in an amorphous state is provided on the amorphous counter-stress layer. In a concluding step, the substrate, including the conductive layer, the amorphous counter-stress layer, and the silicon layer, is heated to at least said poly-silicon crystallization temperature. In this way, the amorphous silicon layer changes its state to a poly-crystalline state.

Since the inventive method provides an amorphous counter-stress layer between the conductive layer and the amorphous silicon layer, said amorphous silicon layer may crystallize to a poly-crystalline state on the conductive layer with reduced mechanical stress. The advantageous addition of an amorphous counter-stress layer provides an improved base for the amorphous silicon layer to change its state to a polycrystalline state, whilst avoiding the generation of mechanical stress between the poly-crystalline silicon and the conductive layer. As a consequence, the inventive method provides an improved fabrication process with reduced alignment errors: device reliability and production yield may be enhanced due to a substantial suppression of device malfunctions. Furthermore, full advantage may be drawn from the provision of conductive layers on top of dielectric layers, and the electric contacting of the former by poly-crystalline silicon.

The inventive amorphous counter-stress layer is free from distinct features which may influence and disturb the crystallization process of the amorphous silicon to a poly-crystalline state, contrary to a silicon poly-crystallization on the conductive layer. Said conductive layer may be itself in a poly-crystalline state, and, therefore, comprise domain boundaries. Said boundaries may act as crystallization seeds during the heating stage that is provided for allowing a phase change of the amorphous silicon, and, hence, are substantially influencing the crystallization process of the silicon. Since the inventive amorphous counter-stress layer remains amorphous at and below the poly-silicon crystallization temperature, the amorphous counter-stress layer provides the advantageous surface at a temperature which is required for the desired phase change of the silicon layer.

According to a second aspect of the present invention, a method for fabricating an integrated device on a semiconductor substrate is provided, wherein the method includes steps as described in the following: In an initial step, a conductive layer is provided on the semiconductor substrate. Said semiconductor substrate has already been described in conjunction with the first aspect of the present invention. In a subsequent step, a crystalline counter-stress layer on the conductive layer is provided. The crystalline counter-stress layer remains crystalline at and below a poly-silicon crystallization temperature. In a next step, a silicon layer in an amorphous state is provided on the crystalline counter-stress layer. In a concluding step, the substrate, including the conductive layer, the crystalline counter-stress layer, and the silicon layer is heated to at least the poly-silicon crystallization temperature. At said poly-silicon crystallization temperature the amorphous silicon layer changes its phase to a poly-crystalline state.

The inventive provision of a crystalline counter-stress layer between the conductive layer and the amorphous silicon layer, provides an advantageous surface for the amorphous silicon layer to crystallize in a poly-crystalline state during a heating stage. Since the crystalline counter-stress layer lacks distinct features such as grain boundaries—which may influence and disturb the crystallization of the silicon to a poly-crystalline state, mechanical stress is reduced. Hence, substrate deformation due to mechanical stress between the conductive layer and the poly-silicon layer is substantially suppressed.

According to a third aspect of the present invention, an integrated circuit device is provided. The integrated circuit device comprises a conductive layer and a poly-crystalline silicon layer. The inventive device further comprises an intermediate counter-stress layer, which is arranged between the poly-crystalline silicon layer and the conductive layer. The intermediate counter-stress layer enables a stress reduced crystallization of the poly-crystalline silicon layer and is amorphous at and below a poly-silicon crystallization temperature.

According to a fourth aspect of the present invention, the intermediate counter-stress layer is crystalline at and below a poly-silicon crystallization temperature.

The inventive addition of an intermediate counter-stress layer reduces mechanical stress within the integrated circuit device. Above all, mechanical stress originating from the interface between poly-crystalline silicon and a conductive layer is strongly attenuated. Hence, an initially amorphous silicon layer may be crystallized to a poly-crystalline state on a conductive layer without causing alignment problems during the fabrication of the device. As a consequence, the device design may draw full advantage from the provision of a conductive layer and its contacting by a poly-crystalline silicon.

According to an embodiment of the present invention, the counter-stress layer is electrically conducting. A conducting counter-stress layer may provide both an advantageous crystallization of an initially amorphous silicon to a poly-crystalline state and electric contact between the poly-crystalline silicon and the underlying conductive layer. The poly-crystalline silicon is usually employed for contacting the conductive layer, which often acts as a capacitor or gate electrode.

According to another embodiment of the present invention, the thickness of the counter-stress layer ranges from 0.5 to 15 nm, such that charge transport across the counter-stress layer is possible by means of tunneling. The advantageous thickness of the counter-stress layer allows for an electric contacting of the poly-crystalline silicon to the underlying conductive layer.

According to another embodiment of the present invention, the poly-silicon crystallization temperature ranges from 550 to 650° C. Said temperature allows for an advantageous transition of the initially amorphous silicon to a poly-crystalline state. At the same time, the counter-stress layer keeps its structural properties and does not change to a disadvantageous state before the amorphous silicon may crystallize to a poly-crystalline state. Said poly-silicon crystallization may vary within said range due to doping of the silicon for controlling and enhancing the electric conductivity of the silicon, which is eventually rendered poly-crystalline.

According to another embodiment of the present invention, the method for fabricating an integrated device further includes a step of heating the substrate, including the conductive layer, the counter-stress layer, and the silicon layer to at least a transformation temperature. Such transformation temperature allows for a transition of the counter-stress layer to form a low resistive layer. The inventive method provides means to change an initially high-resistive counter-stress layer to a low-resistive layer, hence, providing an electric contacting of the conductive layer by the poly-silicon layer.

The heating to the transformation temperature allows for a reaction of the counter-stress layer with the silicon layer to form a low-resistive layer comprising a low-resistive compound of silicon and material of the counter-stress layer. The inventive heating may also allow for a phase change of the counter-stress layer to form a low-resistive layer. Advantageous phase changes may include transitions from an initial amorphous state to a mono- or poly-crystalline state, as well as from an initially mono- or poly-crystalline state to an amorphous state. Furthermore, the counter-stress layer may undergo a phase change between different crystal structures, wherein the final crystal structure of the counter-stress layer is low-resistive. As an alternative, the heating of the counter-stress layer to a transformation temperature may dissolve the counter-stress layer to form a porous layer, and hence allowing for direct contact of the poly-crystalline silicon layer to the conductive layer.

According to another embodiment of the present invention, the heating of the substrate, including the conductive layer, the counter-stress layer, and the silicon layer, to at least the poly-silicon crystallization temperature and to the transformation temperature are carried out in one heating stage. In this way, both transformations—the crystallization of the silicon layer from an amorphous state to a poly-crystalline state, and the transformation of the counter-stress layer to form a low-resistive state—are conducted in a single process step. Hence, the overall number of process steps is reduced, and the efficiency of the method for fabricating an integrated circuit device is optimized.

Preferably, the inventive method for fabricating an integrated device is embedded into a CMOS manufacturing process. Said CMOS manufacturing process is a reliable and well established fabrication process for integrated electronic devices. In this way, the inventive method may be applied as part of an established and efficient manufacturing process.

Alternatively, the heating of the substrate, including the conductive layer, the counter-stress layer, and the silicon layer, to at least the poly-silicon crystallization temperature and at least to the transformation temperature may be carried out as part of a high temperature annealing stage. Latter annealing stage is an established part of a CMOS manufacturing process, and provides a high enough temperature for both the crystallization of the silicon layer and the formation of a low-resistive counter stress layer, whilst not requiring additional heating stages and hence keeping the thermal budget constant.

According to another embodiment of the present invention, the conductive layer comprises at least one of titanium-nitride, titanium-silicon-nitride, titanium-silicon-oxide, ruthenium, ruthenium-nitride, ruthenium-oxide, ruthenium-silicon-nitride, ruthenium-silicon-oxide, tantalum-nitride, tantalum silicon-nitride, tantalum-silicon-oxide, ruthenium-tantalum nitride, ruthenium-tantalum-silicon-nitride, ruthenium-tantalum-silicon-oxide, tungsten-nitride, tungsten-silicon nitride, tungsten-silicon-oxide, tungsten-boron-nitride, or carbon. Said materials provide good conductivity and may be deposited and structured according to design specifications that optimize the overall device performance.

According to another embodiment of the present invention, the counter-stress layer comprises at least one of silicon-nitride, silicon-oxide, silicon-oxy-nitride, carbon, aluminum-oxide, aluminum-silicon-oxide, aluminum-nitride, titanium-aluminum nitride, tantalum-nitride, hafnium-oxide, hafnium-nitride, hafnium-oxy-nitride, hafnium-silicon-oxide, hafnium-silicon-oxy-nitride, hafnium-aluminum-oxide, hafnium-aluminum-nitride and titanium-oxide. Said materials provide good stiction on the underlying conductive layer, and an advantageous physical structure for the amorphous silicon to crystallize to a poly-crystalline state at a poly-silicon crystallization temperature, without changing their advantageous structure at and below said temperature. Furthermore, they may form a low-resistive layer above a transformation temperature by means of a reaction with the silicon or conductive layer, a phase change, or a dissolution to become porous.

According to another embodiment of the present invention, the integrated circuit device further comprises a dielectric element, which is arranged beneath the conductive layer, such to form a capacitor dielectric. In the case of a mainly vertically oriented trench-capacitor, the conductive layer is arranged adjacent to a central dielectric element. A dielectric element may be also formed as part of a transistor element. In said transistor elements often a dielectric-conductor-setup is fabricated for electric current control, also referred to as a gate. Preferably, the dielectric element comprises at least one of aluminum-oxide, silicon-oxide, hafnium-oxide, zirconium-oxide, titanium-oxide, barium-strontium titanium-oxide. Said materials provide both an advantageous dielectric constant and a sufficiently high break down voltage.

BRIEF DESCRIPTION OF THE DRAWINGS

These and other objects and features of the present invention will become clear from the following description, taken in conjunction with accompanying drawings in which.

DETAILED DESCRIPTION OF THE INVENTION

Figure 1A:
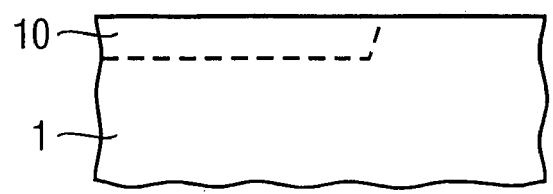
FIG. 1 shows in panels A through F a section of an integrated device during fabrication in selected process stages, according to a first embodiment of the present invention.
Figure 1B:
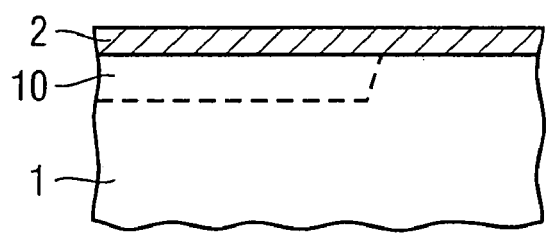
Figure 1C:
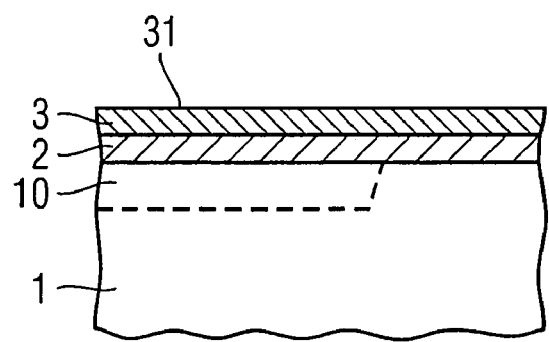
Figure 1D:
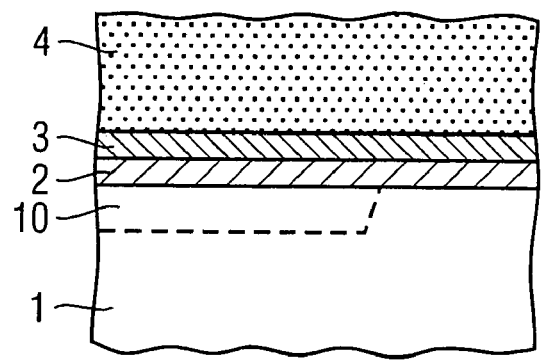
Figure 1E:
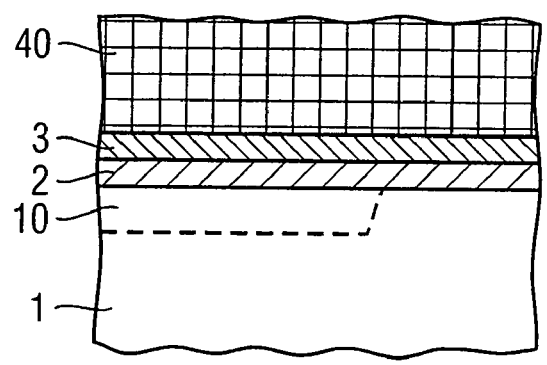
Figure 1F:
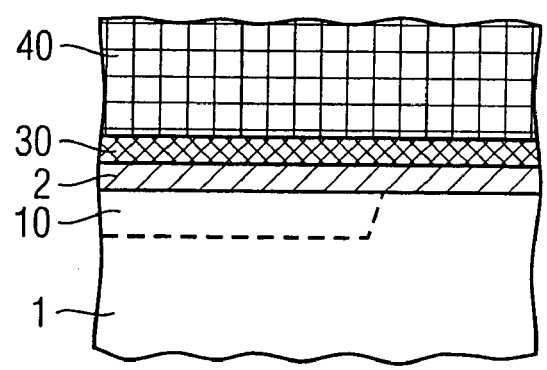

FIG. 1 shows a section of an integrated device as a schematic view, according to a first embodiment of the present invention. As shown in panel A, the integrated device is formed on a semiconductor substrate 1. This semiconductor substrate 1 may comprise functional elements or layers 10, for example conductive or dielectric layers, or doped regions within the substrate 1.

As shown in panel B, a conductive layer 2 is deposited on the functional elements or layers 10 on the substrate 1. Said conductive layer 2 may cover only parts of the functional elements or layers 10 and may also extend to other parts of the substrate 1.

In a subsequent process stage, as shown in panel C, a counter-stress layer 3 is deposited on the conductive layer 2. Said counter-stress layer 3 preferably provides an amorphous or crystalline surface 31. In this way, the surface 31 lacks distinct features, such as grain boundaries or other features that may act as crystallization seeds or may influence a phase change process of a material on top of the counter-stress layer 3.

Panel D shows the section of the integrated device after deposition of an amorphous silicon layer 4. Said amorphous silicon layer 4 is for contacting the conductive layer 2 by means of a subsequent crystallization to a poly-crystalline state. This phase change may be achieved by means of a heating stage during which the substrate 1, including the functional elements or layers 10, the conductive layer 2, the counter-stress layer 3, and the amorphous silicon layer 4, to at least a poly-silicon crystallization temperature. This temperature preferably is in the range of 450 to 650° C.

By means of said heating, the amorphous silicon layer 4 changes its phase and crystallizes in a poly-crystalline state such to form a poly-crystalline silicon layer 40, as shown in Panel E.

By means of another heating stage to at least a transformation temperature, the counter-stress layer 3 changes its phase to form a low-resistive counter-stress layer 30, as shown in panel F. The transition from a counter-stress layer 3 to a low-resistive counter-stress layer 30, may also be achieved in a single heating stage together with the crystallization of the amorphous silicon layer 4 to form the poly-crystalline silicon layer 40. The state of the device may then be illustrated by going directly from panel D to panel F.

The formation of a low-resistive intermediate counter-stress layer 30 establishes electric contact between the poly-silicon layer 40 and the conductive layer 2. This may also be achieved by a counter-stress layer 3 which is already initially conducting. Alternatively, the thickness of the counter-stress layer 3, 30 is in the range of 1.5 to 50 nm, such to allow for charge transport across the counter stress layer 3, 30 by means of tunneling. Furthermore, a transition of an initial counter-stress layer 3 to a low-resistive counter stress layer 30 may occur by means of a chemical reaction of components of the counter-stress layer 3 with the silicon of the silicon layer 4, 40 or the conductive layer 2 to form a low-resistive compound layer 30.

Additionally, the heating to at least a transformation temperature may result in a phase change of a counter-stress layer 3 to form a low-resistive counter-stress layer 30, by means of a change from an amorphous state to a crystalline state, from a crystalline state to an amorphous state, or a phase change from one initial crystalline state to a low-resistive crystalline state. Alternatively, the heating of the counter-stress layer 3 may dissolve the counter-stress layer 3 to form a porous counter stress layer 30, hence establishing direct contact of the poly-crystalline silicon layer 40 to the conductive layer 2.

Possible materials for the substrate 1 include silicon or other related semiconductor materials. The functional elements or layers 10 may comprise a doped semiconductor, conductive materials, such as aluminum, gold, copper, or other metals, or dielectric materials, such as aluminum-oxide, silicon-oxide, hafnium-oxide, zirconium-oxide, titanium-oxide, or barium-strontium-titanium-oxide. The latter materials are commonly used to form capacitor and gate dielectrics, optimizing the dielectric constant and the breakdown voltage. The conductive layer 2 may comprise for example titanium-nitride, titanium-silicon-nitride, titanium-silicon-oxide, ruthenium, ruthenium-nitride, ruthenium-oxide, ruthenium-silicon-nitride, ruthenium-silicon-oxide, tantalum-nitride, tantalum silicon-nitride, tantalum-silicon-oxide, ruthenium-tantalum nitride, ruthenium-tantalum-silicon-nitride, ruthenium-tantalum-silicon-oxide, tungsten-nitride, tungsten-silicon nitride, tungsten-silicon-oxide, tungsten-boron-nitride, or carbon.

The counter stress layer 3, 30 may comprise silicon-nitride, silicon-oxide, silicon-oxy-nitride, carbon, aluminum-oxide, aluminum-silicon-oxide, aluminum-nitride, titanium-aluminum nitride, tantalum-nitride, hafnium-oxide, hafnium-nitride, hafnium-oxy-nitride, hafnium-silicon-oxide, hafnium-silicon-oxy-nitride, hafnium-aluminum-oxide, hafnium-aluminum-nitride and titanium-oxide.

Figure 2:
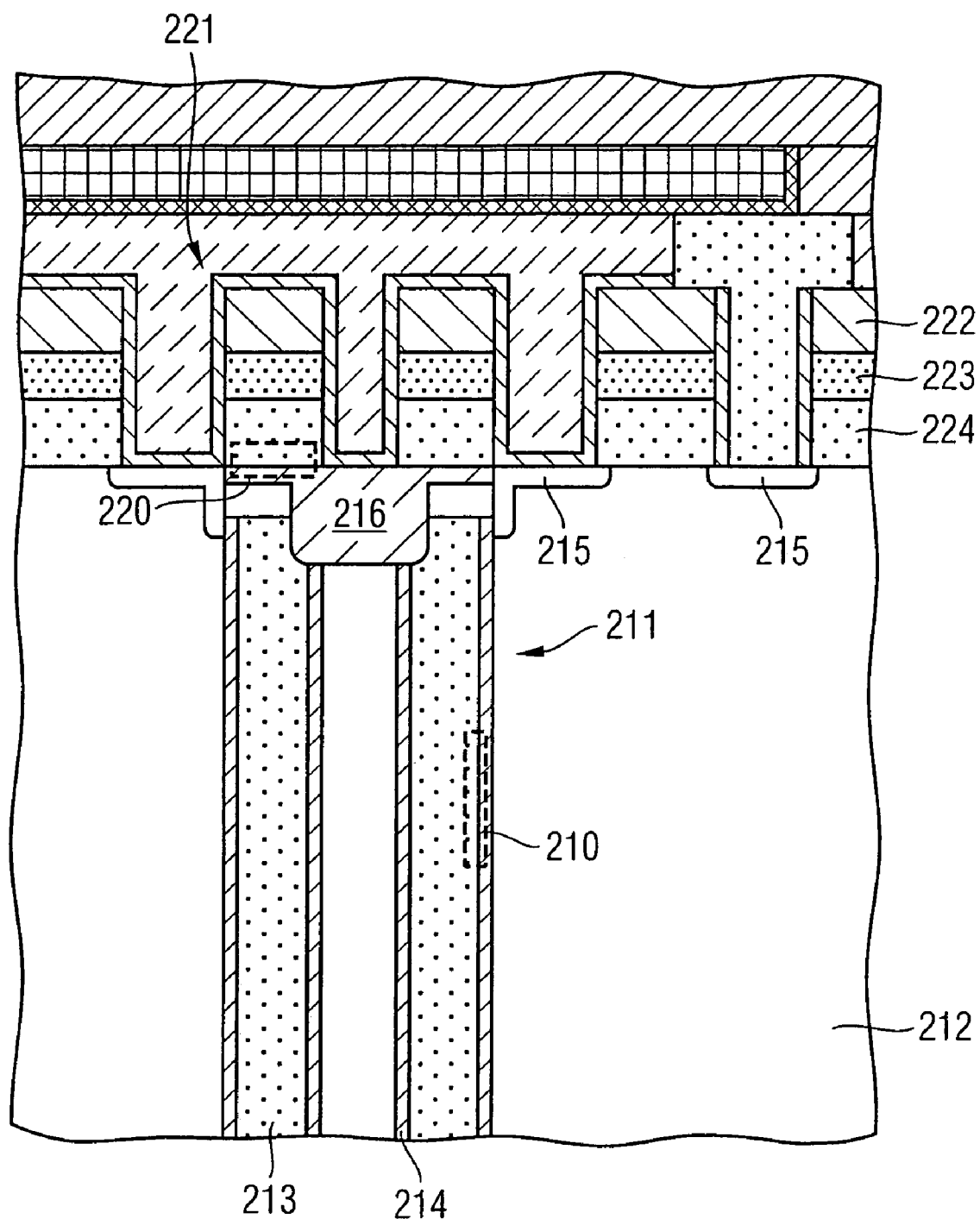
FIG. 2 shows a section of an integrated electronic device as a schematic view.

FIG. 2 shows a schematic sectional view of an integrated device. The integrated device is formed in a semiconductor substrate 212. As an example, the integrated device comprises electronic elements, such as trench capacitor elements 211 and so-called gate-stacks 221. Said trench capacitor elements 211 comprise a capacitor dielectric element 214 surrounding an inner electrode element 213. The latter inner electrode element 213 is often formed by filling the trench with poly-crystalline silicon, and hence is also referred to as the poly-silicon element 213. Other prominent electronic elements include transistor elements formed by doped regions 215 of the substrate 212, and gate-stacks 221 above a dielectric element 216. Said gate stack 221 may comprise a poly-silicon element 224, and other metal and silicide elements 222 and 223 respectively.

Figure 3A:
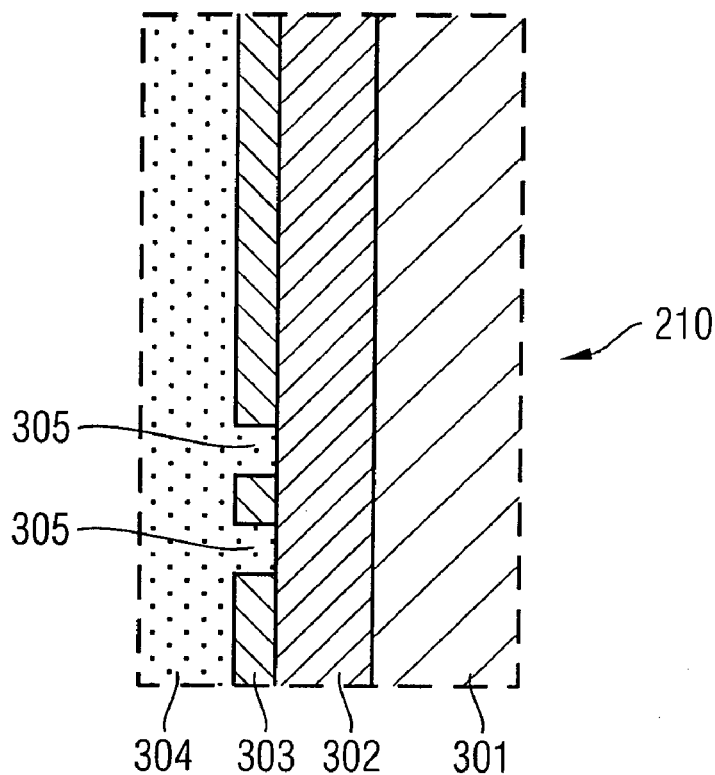
FIG. 3 shows in panels A and B a detailed view of parts of an integrated circuit as a schematic view, according to a second and third embodiment of the present invention, respectively.
Figure 3B:
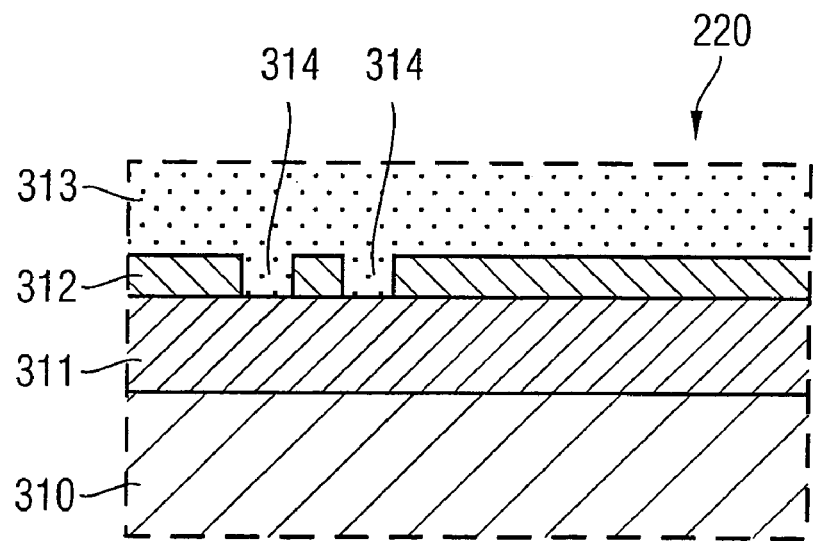

According to the present invention, the interfaces between a dielectric element 214, 216 and a poly-silicon element 213, 224 comprise intermediate layers. The broken-lined regions 210 and 220 are magnified as a detailed view in FIGS. 3A and 3B, respectively.

FIG. 3 shows a detailed view of sections of the integrated device shown in FIG. 2, according to a second and third embodiment of the present invention.

Panel 3A shows a detailed view of the layer setup at the interface of a dielectric element 214 and a poly-silicon element 214 located in the region 210 of FIG. 2. According to this second embodiment, a conductive layer 302 is adjacent to a dielectric element 301. Between the conductive layer 302 and a poly-silicon element 304, an intermediate counter-stress layer 303 is arranged. Said intermediate counter-stress layer 303 allows for a stress-reduced crystallization of the poly-silicon layer 304 from an initially amorphous state. The intermediate counter-stress layer 303 may be low-resistive or may comprise pores 305, such to enable direct electric contact between the poly-silicon element 304 and the conductive layer 302.

Panel B shows the section 220 of FIG. 2, according to a third embodiment of the present invention. In this section 220, a gate dielectric element 310 is covered by a conductive layer 311. A poly-silicon element 313 is arranged on top of the conductive layer 311. Said conductive layer 311 acts as a gate electrode above the gate dielectric element 310. Between the conductive layer 311 and the poly-silicon element 313 an intermediate counter-stress layer 312 is arranged, to allow for a crystallization of an initially amorphous silicon to form the poly-crystalline silicon element 313. Again, the intermediate counter-stress layer 312 may be electrically conducting, or may comprise pores 314, both to establish electric contact between the poly-silicon element 313 and the conductive layer 311.

The preceding description only describes advantageous exemplary embodiments of the invention. The features disclosed therein and the claims and the drawings can, therefore, be essential for the realization of the invention in its various embodiments, both individually and in any combination.

What is claimed is:

1. Integrated circuit device comprising a conductive layer and a poly-crystalline silicon layer, wherein the integrated circuit device further comprises an intermediate counter-stress layer, said intermediate counter-stress layer being arranged between said poly-crystalline silicon layer and said conductive layer, and enabling stress-reduced crystallization of the poly-crystalline silicon layer, and wherein said intermediate counter-stress layer is amorphous at and below a poly-silicon crystallization temperature, wherein the intermediate counter-stress layer is electrically conducting.

2. Integrated circuit device comprising a conductive layer and a poly-crystalline silicon layer, wherein the integrated circuit device further comprises an intermediate counter-stress layer, said intermediate counter-stress layer being arranged between said poly-crystalline silicon layer and said conductive layer, and enabling stress-reduced crystallization of the poly-crystalline silicon layer, and wherein said intermediate counter-stress layer is amorphous at and below a poly-silicon crystallization temperature, wherein the thickness of the intermediate counter-stress layer ranges from 0.5 nm to 15 nm, such that charge transport across the intermediate counter-stress layer is possible by means of tunneling.

3. Integrated circuit device comprising a conductive layer and a poly-crystalline silicon layer, wherein the integrated circuit device further comprises an intermediate counter-stress layer, said intermediate counter-stress layer being arranged between said poly-crystalline silicon layer and said conductive layer, and enabling stress-reduced crystallization of the poly-crystalline silicon layer, and wherein said intermediate counter-stress layer is amorphous at and below a poly-silicon crystallization temperature, wherein the intermediate counter-stress layer is a porous layer.

4. Integrated circuit device comprising a conductive layer and a poly-crystalline silicon layer, wherein the integrated circuit device further comprises an intermediate counter-stress layer, said intermediate counter-stress layer being arranged between said poly-crystalline silicon layer and said conductive layer, and enabling stress-reduced crystallization of the poly-crystalline silicon layer, and wherein said intermediate counter-stress layer is amorphous at and below a poly-silicon crystallization temperature, wherein the integrated circuit device further comprises a dielectric element, said dielectric element being arranged beneath the conductive layer, such to form a capacitor dielectric.

5. Integrated circuit device as claimed in claim 4, wherein the dielectric element comprises at least one of $Al_2O_3$, $SiO_2$, HfO, ZrO, $TiO_2$, $Ba_{1-x}Sr_xTiO_3$.

6. Integrated circuit device comprising a conductive layer and a poly-crystalline silicon layer, wherein the integrated circuit device further comprises an intermediate counter-stress layer, said intermediate counter-stress layer being arranged between said poly-crystalline silicon layer and said conductive layer, and enabling stress-reduced crystallization of the poly-crystalline silicon layer, and wherein said intermediate counter-stress layer is crystalline at and below a poly-silicon crystallization temperature.

7. Integrated circuit device as claimed in claim 6, wherein the intermediate counter-stress layer is electrically conducting.

8. Integrated circuit device as claimed in claim 6, wherein the thickness of the intermediate counter-stress layer ranges from 0.5 nm to 15 nm, such that charge transport across the intermediate counter-stress layer is possible by means of tunneling.

9. Integrated circuit device as claimed in claim 6, wherein the intermediate counter-stress layer is a porous layer.

10. Integrated circuit device as claimed in claim 6, wherein the conductive layer comprises at least one of TiN, TiSiN, TiSiO, Ru, RuN, RuO, RuSiN, RuSiO, TaN, TaSiN, TaSiO, RuTaN, RuTaSiN, $RuTaSiO_2$, WN, WSiN, WSiO, WBN, carbon.

11. Integrated circuit device as claimed in claim 6, wherein the intermediate counter-stress layer comprises at least one of SiN, $SiO_2$, SiON, C, $Al_2O_3$, AlSiO, AlN, TiAlN, TaN, HfO, HfN, HfON, HfSiO, HfSiON, HfAlO, HfAlN, $TiO_2$.

12. Integrated circuit device as claimed in claim 6, wherein the integrated circuit device further comprises a dielectric element, said dielectric element being arranged beneath the conductive layer, such to form a capacitor dielectric.

13. Integrated circuit device as claimed in claim 12, wherein the dielectric element comprises at least one of $Al_2O_3$, $SiO_2$, HfO, ZrO, $TiO_2$, $Ba_{1-x}Sr_xTiO_3$.

14. Integrated circuit device as claimed in claim 1, wherein the conductive layer comprises at least one of TiN, TiSiN, TiSiO, Ru, RuN, RuO, RuSiN, RuSiO, TaN, TaSiN, TaSiO, RuTaN, RuTaSiN, $RuTaSiO_2$, WN, WSiN, WSiO, WBN, carbon.

15. Integrated circuit device as claimed in claim 1, wherein the intermediate counter-stress layer comprises at least one of SiN, $SiO_2$, SiON, C, $Al_2O_3$, AlSiO, AlN, TiAlN, TaN, HfO, HfN, HfON, HfSiO, HfSiON, HfAlO, HfAlN, $TiO_2$.

16. Integrated circuit device as claimed in claim 2, wherein the conductive layer comprises at least one of TiN, TiSiN, TiSiO, Ru, RuN, RuO, RuSiN, RuSiO, TaN, TaSiN, TaSiO, RuTaN, RuTaSiN, $RuTaSiO_2$, WN, WSiN, WSiO, WBN, carbon.

17. Integrated circuit device as claimed in claim 2, wherein the intermediate counter-stress layer comprises at least one of SiN, $SiO_2$, SiON, C, $Al_2O_3$, AlSiO, AlN, TiAlN, TaN, HfO, HfN, HfON, HfSiO, HfSiON, HfAlO, HfAlN, $TiO_2$.

18. Integrated circuit device as claimed in claim 3, wherein the conductive layer comprises at least one of TiN, TiSiN, TiSiO, Ru, RuN, RuO, RuSiN, RuSiO, TaN, TaSiN, TaSiO, RuTaN, RuTaSiN, $RuTaSiO_2$, WN, WSiN, WSiO, WBN, carbon.

19. Integrated circuit device as claimed in claim 3, wherein the intermediate counter-stress layer comprises at least one of SiN, $SiO_2$, SiON, C, $Al_2O_3$, AlSiO, AlN, TiAlN, TaN, HfO, HfN, HfON, HfSiO, HfSiON, HfAlO, HfAlN, $TiO_2$.

20. Integrated circuit device as claimed in claim 4, wherein the conductive layer comprises at least one of TiN, TiSiN, TiSiO, Ru, RuN, RuO, RuSiN, RuSiO, TaN, TaSiN, TaSiO, RuTaN, RuTaSiN, $RuTaSiO_2$, WN, WSiN, WSiO, WBN, carbon.

21. Integrated circuit device as claimed in claim 4, wherein the intermediate counter-stress layer comprises at least one of SiN, $SiO_2$, SiON, C, $Al_2O_3$, AlSiO, AlN, TiAlN, TaN, HfO, HfN, HfON, HfSiO, HfSiON, HfAlO, HfAlN, $TiO_2$.

* * * * *